United States Patent [19]

Okumura et al.

[11] Patent Number: 4,468,313
[45] Date of Patent: Aug. 28, 1984

[54] SPUTTERING TARGET

[75] Inventors: Katsuya Okumura, Yokohama; Masaaki Ueda, Kawasaki, both of Japan

[73] Assignee: Tokyo Shibaura Denki Kabushiki Kaisha, Kawasaki, Japan

[21] Appl. No.: 519,906

[22] Filed: Aug. 3, 1983

[30] Foreign Application Priority Data

Mar. 3, 1981 [JP] Japan ................................. 56-30209

[51] Int. Cl.³ .............................................. C23C 15/00
[52] U.S. Cl. ................................. 204/298; 204/192 R
[58] Field of Search ........................................ 204/298

[56] References Cited

U.S. PATENT DOCUMENTS 3,502,562  3/1970  Humphries ........................ 204/298
4,200,510  4/1980  O'Connell et al. ................. 204/298
4,297,189  10/1981 Smith et al. ........................ 204/298

OTHER PUBLICATIONS

Sinclair et al., Review of Scientific Instruments, 33 (#7) 1962, pp. 744–747.
Hanak, Proc. 6th Intern. Vacuum Cong. 1974; J. Appl. Phys., Suppl. 2, Pt. 1, 1974, pp. 809–811.

Primary Examiner—Arthur P. Demers
Attorney, Agent, or Firm—Finnegan, Henderson, Farabow, Garrett & Dunner

[57] ABSTRACT

A sputtering target comprises a backing plate, a mosaic layer laid on the backing plate, and a keep jig contacting the inner peripheral edge and outer peripheral edge of the mosaic layer, thus attaching the layer to the backing plate. The mosaic layer is substantially circular and consists of a first group of fan-shaped plates made of a first target material and a second group of fan-shaped plates of a second target material. The plates of the second group are divided into subgroups each consisting of at least one plate. These subgroups are interposed among the fan-shaped plates of the first group. The plates have a notch in the narrower end, are connected side by side to each other, and are arranged with top surfaces flush with one another.

7 Claims, 12 Drawing Figures

SPUTTERING TARGET

BACKGROUND OF THE INVENTION

This invention relates to a sputtering target used with a sputtering equipment and ion-milling equipment, and more particularly to a sputtering target in fabricating a film consisting of two or more components.

At present, the gate electrode of an MOS LSI device is generally prepared from polycrystalline silicon. When, however, it is attempted to develop a high speed MOS LSI device, a high sheet resistance of a polycrystalline layer presents a great hindrance. Even when a polycrystalline silicon layer is fully doped with an impurity, the lower limit of the specific resistance of said silicon layer is around 10 $\Omega\square$. It is impossible to reduce the specific resistance to a lower extent that said level.

Recently, therefore, it is widely accepted to prepare the gate electrode of the MOS LSI device from a silicide of refractory metal of low specific resistance such as molybdenum or tungsten. A film of such refractory metal silicide is generally formed by the process of vacuum thermal deposition or chemical vapor deposition (CVD). However, this sputtering process is more widely accepted which ensures the easy formation of such film. A refractory metal silicide film formed by the sputtering process is carried out by applying a target prepared from refractory metal silicide by a sintering process. However, this target prepared by the sintering process is difficult to be highly purified, greatly obstructing the formation of the gate electrode of the MOS LSI device.

Refractory metal and silicon can respectively be highly purified in the single form. To date, therefore, a target constructed, as shown in FIG. 1, by mounting a plurality of silicon strips 2 on a refractory metal substrate 1 has been subjected to sputtering to produce a refractory metal silicide film. In this case, it is obviously possible to produce a target by mounting strips of refractoy metal on a silicon substrate.

The sputtering process applying the target constructed as shown in FIG. 1 has the advantage of fabricating a refractory metal silicide film with great ease and high purity. However, the sputtering process of FIG. 1 which involves the application of a target constructed by mounting a plurality of silicon strips 2 on a refractory metal substrate 1 has the drawbacks that abnormal discharge is likely to take place along the edge of the silicon strips 2, resulting in the variation of the composition of an intended refractory metal silicide film or tending to give rise to the splashing of the fine particles of the target materials of the target. Further, the target of FIG. 1 is only applicable to the sputter-up process (in which the target is held in a lower position and a substrate on which a refractory metal silicide membrane is to be deposited is kept in an upper position). However, the target of FIG. 1 presents difficulties when it is applied not only to the sputter-down process but also to the side-sputter process capable of effectively suppressing the contamination of the refractory metal silicide film during its formation (said side-sputter process is carried out with the target and substrate made to face each other perpendicularly). The reason is that the silicon strips 2 disposed on the refractory metal substrate 1 tend to fall off.

SUMMARY OF THE INVENTION

It is accordingly an object of this invention to provide a sputtering target which suppresses the occurrence of abnormal discharge during the sputtering process, and ensures the formation of a high purity refractory metal silicide film which is satisfactorily saved from variations in the composition and the splashing of the fine particles of the target materials of said film. Another object of the invention is to provide a sputtering target which is applicable not only to the sputter-up and sputter-down processes, but also to the side-sputter process which effectively suppresses the contamination of an intended film during its formation.

Another object of the invention is to provide a sputtering target which enables the composition of a refractory metal silicide film to be easily varied with high precision.

Still another object of the invention is to provide a sputtering target which assures the uniform formation of a refractory metal silicide film even when an erosion area is shifted during the sputtering process.

A further object of the invention is to provide a circular sputtering target which comprises fan-shaped plates free from cracking during the sputtering process.

To attain the above-mentioned object, this invention provides a circular sputtering target formed of a plurality of fan-shaped plates of different target materials, which are disposed flush with each other.

DETAILED DESCRIPTION OF THE PREFERRED EMBODIMENTS

Figure 1:
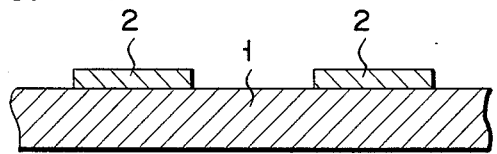
FIG. 1 shows the cross section of the conventional sputtering target.
Figure 2:
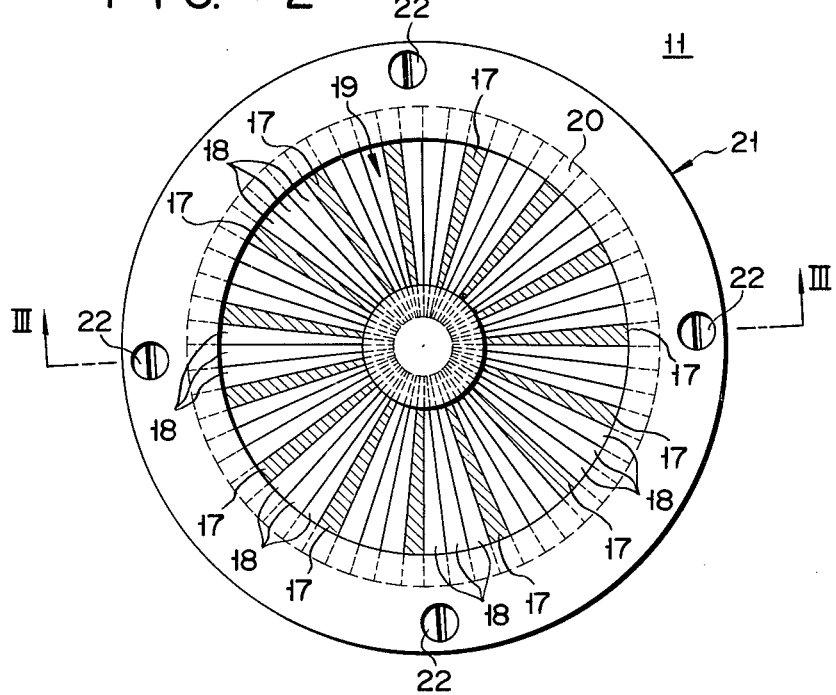
FIG. 2 is a plan view of a sputtering target according to a first embodiment of this invention.
Figure 3:
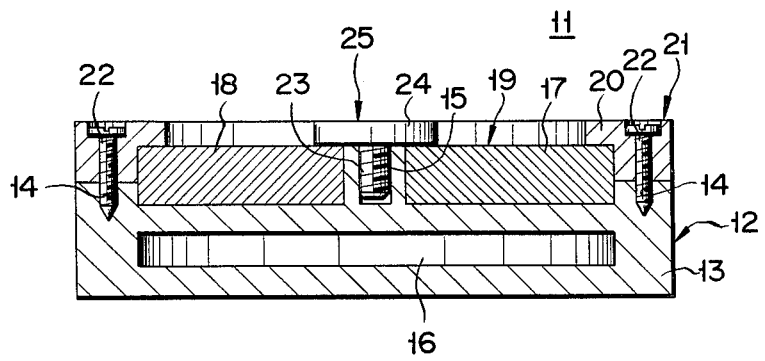
FIG. 3 is a sectional view of the sputtering target of FIG. 2 on line III—III.

Description will now be given with reference to the accompanying drawings of a sputtering target 11 according to a first embodiment of this invention. FIG. 2 is a plan view of the sputtering target 11. FIG. 3 is a cross sectional view thereof on line III—III. Reference numeral 12 denotes a circular backing plate which is prepared from, for example, copper and constitutes part of the sputtering target 11. A ring-shaped projection 13 is formed along the upper peripheral edge of the circular backing plate 12. Four screw holes 14 are cut into the ring-shaped projection 13 from above at equal circumferential intervals. A cylinder 15 whose inner peripheral wall is screw threaded is integrally formed at the center of the upper portion of the circular backing plate 12. A hollow 16 is formed in the circular backing plate 12 to allow for the passage of cooling water.

Figure 4:
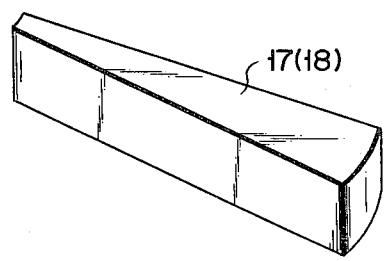
FIG. 4 is an oblique view of one of silicon strips and molybdenum strips of the sputtering target of FIG. 2.

A mosaic layer 19 is mounted on a ring-shaped surface defined between the cylinder 15 and the ring-shaped projection 13 of the circular backing plate 12. The mosaic layer 19 is formed of a plurality of high purity molybdenum strips 17 and a plurality of high purity silicon strips 18 which are used as the plates of a sputtering target. As shown in FIG. 4, the molybdenum strips 17 and silicon strips 18 are each shaped like a fan-shaped block whose outer end portion is made into the arcuate form, and whose top and bottom planes are shaped like a fan having an open angle of, for example, 6°. The mosaic layer 19 is constructed by mounting, for example, fifteen molybdenum strips 17 at a pitch angle of 18° on the circular backing plate 12, and interposing three silicon strips 18 between the respective adjacent molybdenum strips 17 (totaling 45 in number) in such a manner that said silicon strips 18 contact each other on the side and are disposed with the same surface level.

A ring-shaped keep jig 21 whose inner peripheral wall is provided with a stepped portion 20 is mounted on the ring-shaped projection 13 of the circular backing plate 12. The ring-shaped keep jig 21 is fixed to the ring-shaped projection 13 by means of screws 22, thereby supporting the upper peripheral wall of the mosaic layer 19. Threadedly fitted into the cylinder 15 of the circular backing plate 12 is a keep jig 25 whose threaded portion 23 is covered at the top with a circular flange 24. The periphery of the central portion of the mosaic layer 19 is supported by the flange 24 of the keep jig 25.

Description will now be given with reference to FIG. 5 of a side-sputter equipment to which the aforementioned sputtering target is fitted and also of a process of forming a molybdenum silicide film by means of said equipment.

Figure 5:
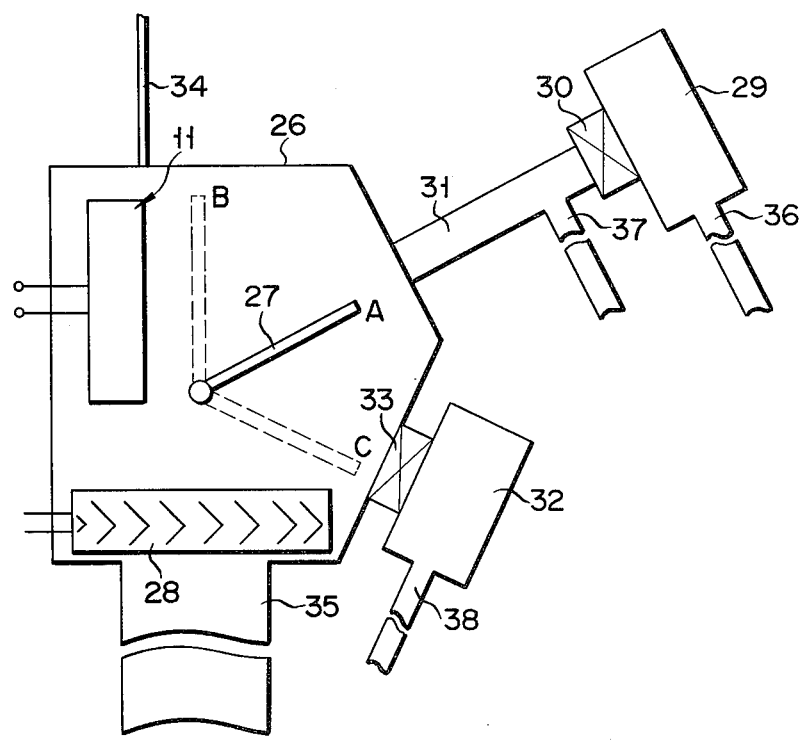
FIG. 5 schematically illustrates of a side-sputtering equipment.

Reference numeral 26 given in FIG. 5 denotes a sputtering chamber in which the sputtering target 11 of FIGS. 2 and 3 and a rotatable platen 27 are received. A cooling member 28 through which liquid nitrogen flows is set near the inside of the bottom of the sputtering chamber 26. Reference numeral 29 is a load chamber in which a substrate is placed, in a state stored in a cassette (not shown). The load chamber 29 communicates through a gate 30 with a heating chamber 31 used to preheat the substrate. This preheating chamber 31 is connected to said sputtering chamber 26. A reference numeral 32 given in FIG. 5 represents an unload chamber for returning the substrate on which a molybdenum silicide film is deposited to the cassette (not shown). This unload chamber 32 communicates with the sputtering chamber 26 through a gate 33. An argon gas feed pipe 34 is connected to the upper wall of the sputtering chamber 26. The sputtering chamber 26, load chamber 29, heating chamber 31 and unload chamber 32 are connected to an exhaust device, for example, a cryopump through exhaust pipes 35 to 38.

Description will now be given of a process of forming a molybdenum silicide film by the side-sputter equipment of FIG. 5. The sputtering chamber 26, load chamber 29, heating chamber 31 and unload chamber 32 are evacuated by operating, for example, a cryopump (not shown). Thereafter, the gate 30 is opened to drive a substrate stored in a cassette held in the load chamber 29 into the heating chamber 31. A heated substrate is placed in the platen 27 held in the sputtering chamber 26. After receiving the heated substrate at position A, the platen 27 is rotated to position B to face the sputtering target 11. Later argon gas is taken into the sputtering chamber 26 through the feed pipe 34 at the flow rate of 30 to 40 SCCM to set the argon gas pressure within the sputtering chamber 26 at $3 \times 10^{-3}$ Torr. D.C. input power 3A is supplied from a power source (not shown) to the sputtering target 11 with the plasma potential set at 450 V, thereby depositing a molybdenum silicide film on the substrate disposed on the platen 27. Later, the platen 27 is shifted to a position C, and brought back into a cassette held in the unload chamber 32 by opening the gate 33. Thereafter, the platen 27 resumes the position A and is kept in a waiting state until the succeeding substrate is taken in. The above-mentioned steps are successively repeated, until a molybdenum silicide film is deposited on all the substrates stored in the cassette held in the load chamber 29.

As seen from FIGS. 2 and 3, the sputtering target 11 according to a first embodiment of this invention indicates a mosaic layer 19 constructed by arranging a plurality of molybdenum strips 17 each consisting of a fan-shaped plate block and a plurality of silicon strips 18 each bearing the same shape as the molybdenum strips 17 in such a manner that said molybdenum strips 17 and silicon strips 18 contact each other on the side and remain flush with each other. Therefore, the sputtering target of the invention enables a high purity molybdenum silicide film having an excellent quality to be easily sputtered on a substrate without giving rise to abnormal discharge along the edge of a silicon strip as has been observed in the conventional sputtering target. The mosaic layer 19 embodying the invention which is supported on the backing plate 12 of the sputtering target 11 by the ring-shaped keep jig 21 and another keep jig 25 is adapted to be applied not only to the sputter-up and sputter-down processes, but also to the side-sputter process which effectively suppresses contamination caused by the inclusion of an impurity.

Figure 6:
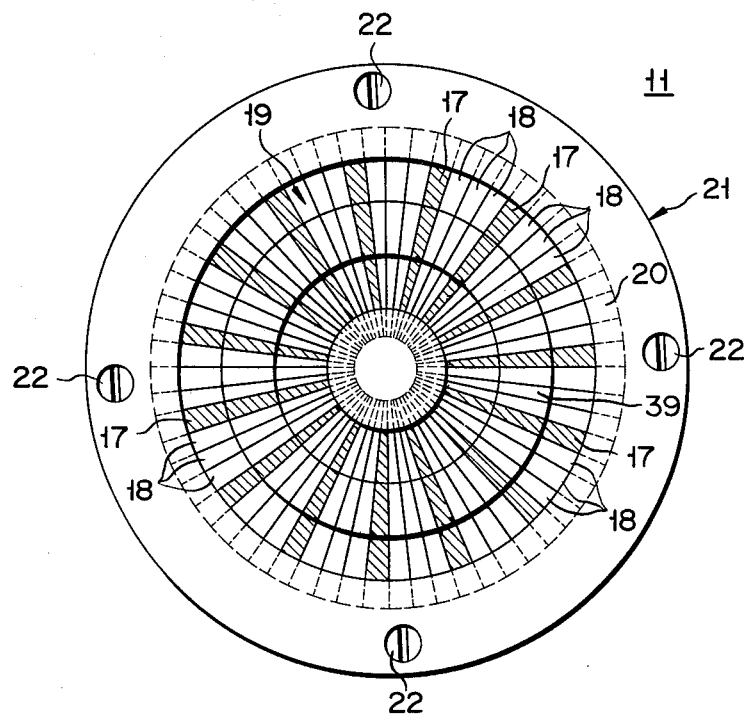
FIG. 6 is a plan view of a sputtering target in which an erosion area is produced by sputtering process.

With the sputtering target 11 of the invention, the surface portion of the molybdenum strips 17 and silicon strips 18 is sputtered out, for example, by activated ions to produce a ring shaped erosion area 39 (FIG. 6). Since, however, the molybdenum strips 17 and silicon strips 18 constitute substantially fan-shaped plate blocks, it is possible to produce a molybdenum silicide film having a prescribed composition even when the erosion area is shifted by means of a magnetic field in order to form said molybdenum silicide film with a uniform thickness. Since, as described above, the molybdenum strips 17 and silicon strips 18 are made into substantially fan-shaped plates, it is possible to adjust the composition of the molybdenum silicide film easily and precisely, if the mosaic layer 19 is constructed by varying the opening angle of the molybdenum strips 17 and the pitch angle between every two adjacent molybdenum strips 17 (the opening angle of a single silicon strip 18 or that of a segment consisting of a plurality of silicon strips 18). For instance, sputtering was applied under the aforementioned condition by the side sputter equipment of FIG. 5 to the sputtering target 11 according to the first embodiment of this invention which comprises the mosaic layer 19 constructed by arranging every two adjacent molybdenum strips 17 respectively having an opening angle of 6° at a pitch angle of 18° and interposing three silicon strips 18 each having an opening angle of 6° between said two molybdenum strips 17. Then a molybdenum silicide film having a composition of MoSi$_{2.6}$ was formed. Sputtering was applied under the same condition as described above to a sputtering target comprising a mosaic layer 19 contructed by arranging fifteen molybdenum strips each having an opening angle of 8° at a pitch angle of 16°, and interposing two silicon strips each having an opening angle of 8° between every two adjacent molybdenum strips. Then a molybdenum silicide film having a composition of MoSi$_2$ was produced. When a molybdenum silicide film is formed, the molybdenum strips and silicon strips are repeatively chosen to have an opening angle of 3° to 45° or preferably 6° to 30°. The reason is that a opening angle smaller than 3° presents difficulties in the fabrication of the subject sputtering target and a opening angle larger than 45° tends to deteriorate the uniform quality of the resultant molybdenum silicide film.

The sputtering target 11 of this invention is divided into substantially fan-shaped plates and is saved from the cracking which might result from thermal shocks occuring while the target 11 is sputtered. Particularly any portion made of silicon, which has a low resistance to thermal shocks, is formed of a plurality of silicon strips, thereby noticeably lengthening the effective life of a sputtering target.

Figure 7:
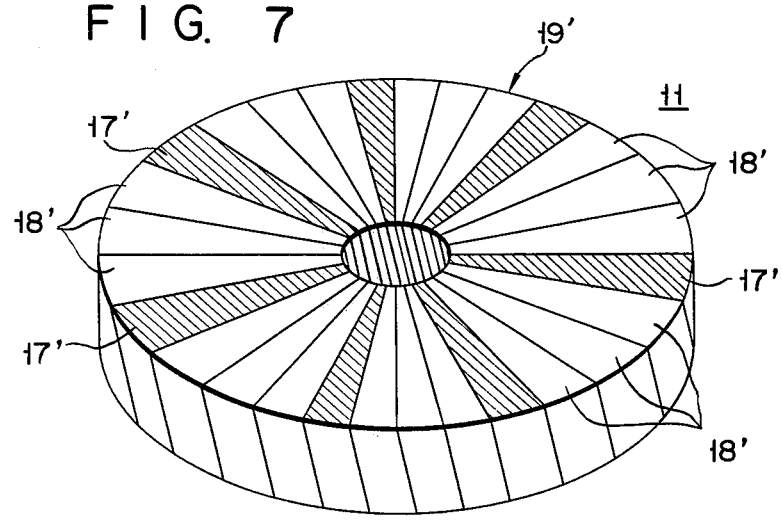
FIG. 7 is an oblique view of the main part of a sputtering target according to a second embodiment of the invention.

A sputtering target 11 according to the first embodiment of this invention comprises a plurality of molybdenum strips and a plurality of silicon strips. Each of these strips constitutes a fan-shaped plates whose side planes are perpendicular to the substantially fan-shaped top and bottom planes. However, the sputtering target 11 of the invention need not be limited to the above-mentioned type. But it is possible to construct a mosaic layer 19' by arranging, as shown in FIG. 7, a plurality of molybdenum strips 17' and silicon strips 18' whose side planes are inclined in the same direction at an angle of 70° to the substantially fan-shaped top and bottom planes in such a manner that said inclined planes of both molybdenum and silicon strips 17', 18' are brought into contact with each other. A sputtering target 11 comprising such mosaic layer 19' makes it possible to produce a molybdenum silicide film more relieved from the intrusion of an impurity than in the target 11 according to the aforesaid first embodiment. The sputtering target 11 according to said first embodiment in which the mosaic layer 19 is formed of a plurality of molybdenum strips 17 and a plurality of silicon strips 18 whose side planes are perpendicular to the substantially fan-shaped top and between planes has the drawback that while the target 11 is sputtered, a plasma introduced substantially perpendicular to the surface of the mosaic layer 19 passes through a region defined between the side plane of the molybdenum strip 17 and that of the silicon strip 18, and also through a region defined between the side planes of every two adjacent silicon strips 18, 18 and is brought to the surface of the copper backing plate 12 of the sputtering target 11; and the particles of the copper backing plate 12 are sputtered out by said plasma likely to be carried into the molybdenum silicide film. In contrast, the mosaic layer 19' of FIG. 7 in which a region defined between the side plane of the molybdenum strip 17' and that of the silicon strip 18' and also a region defined between the side planes of every two adjacent silicon strips 18', 18' are included to the surface of the mosaic layer 19' at an angle of 70° has the advantages that the copper backing plate 12 is concealed from the incoming argon ion by the molybdenum strips 17' and silicon strips 18', thereby preventing an impurity from being brought into a region between the side plane of the molybdenum strip 17' and silicon strip 18' or into a region defined between the side planes of adjacent silicon strips 18', suppressing the intrusion of an impurity into the molybdenum siliside film, and enabling a sputtering target to be manufactured with higher purity and more uniform quality. The mutually facing planes of the molybdenum strips 17' and silicon strips 18' which are inclined in the same direction define a parallelogram. Even when, therefore, the mutually facing planes are eroded by plasma during sputtering, the areas of the resultant exposed surfaces of the molybdenum strip 17' and silicon strips 18' do not substantially change, thereby ensuring the formation of a molybdenum silicide film with a prescribed composition, and high reproducibility.

Figure 8:
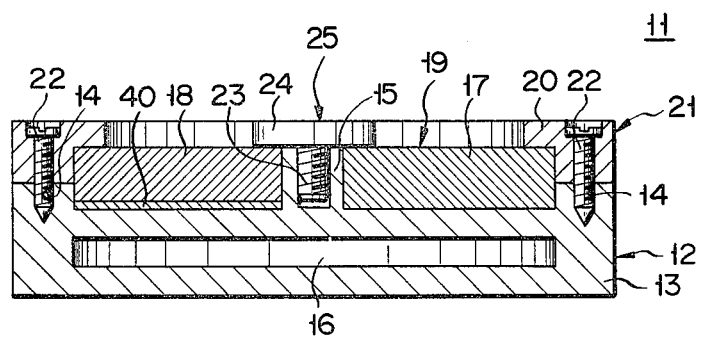
FIG. 8 indicates the cross section of a sputtering target according to a third embodiment of the invention.

With the first embodiment of this invention shown in FIG. 3, silicon strips 18 were directly mounted on the copper backing plate 12. However, it is possible to construct a sputtering target 11 by mounting on the backing plate 12 a silicon strip 18 with a conductive metal film, e.g., a gold film 40, thermally deposited on the backside as shown in FIG. 8. This arrangement enables a molybdenum silicide film to be formed with a prescribed composition and uniform quality even when the sputtering target 11 is supplied with a high input power (for example, larger than 10 A) in order to accelerate the speed at which the molybdenum silicide film is formed. The sputtering target 11 of FIG. 3 according to the first embodiment of this invention, both molybdenum strip 17 and silicon strip 18 are directly disposed on the copper backing plate 12. Electric resistance between the silicon strip 18 and copper backing plate 12 is far higher than between the molybdenum stip 17 and copper backing plate 12. When, therefore, it is attempted to supply larger input power to a sputtering target in order to accelerate the forming of a molybdenum silicide film, then sufficient plasma ceases to impinge on the silicon strip 18. As a result, unbalance appears between the extent to which silicon is sputtered out and that at which molybdenum is sputtered out, presenting difficulties in quickly forming a molybdenum silicide film with a desired composition. In contrast, the sputtering target of FIG. 8 according to a third embodiment of this invention, which is constructed by mounting molybdenum strips 17 and silicon strips 18 on the backside of which a conductive gold film 40 is thermally deposited, is mounted on the backing plate 12. Consequently, electric resistance between the silicon strip 18 and copper backing plate 12 is low enough to let plasma impingement take place more noticeably by supplying a large input power. As a result, a molybdenum silicide film can be quickly formed with a desired composition. In this case, the same result can be attained by interposing a soft metal film such as an aluminum foil or gold foil between the silicon strip 18 and copper backing plate 12 instead of thermally depositing, for example, a gold film on the backside of the silicon strip 18 and pressing the soft gold film against the silicon strip 18 and copper backing plate 12 by exerting pressure from the side of the silicon strip 18.

With the foregoing embodiments, a sputtering target was constructed by arranging a plurality of moldbenum strips 17 and silicon strips 18 in the prescribed pattern.

Figure 9:
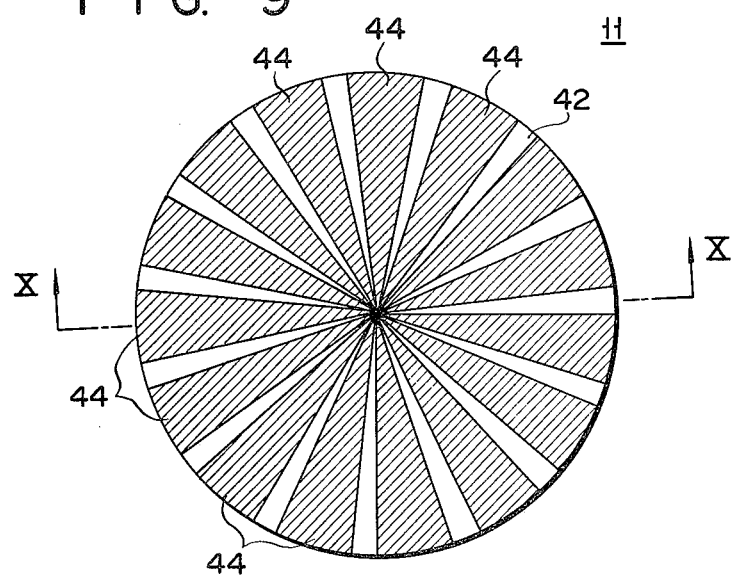
FIG. 9 is a plan view of a sputtering target according to a fourth embodiment of the invention.
Figure 10:
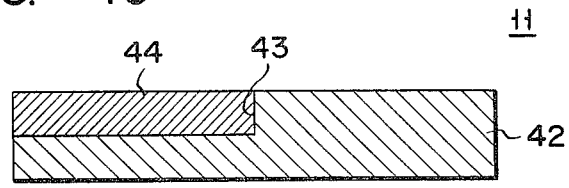
FIG. 10 is a cross sectional view on line X—X of the sputtering target of FIG. 9.

However, the object of this invention can also be attained by forming a sputtering target arranged as shown in FIGS. 9 and 10 (a fourth embodiment). The sputtering target of FIGS. 9 and 10 is constructed by forming fifteen fan-shaped grooves 43 having an opening angle of, for example, 18° on a molybdenum disc 42 concurrently acting as a backing plate at a pitch angle of 6° and embedding fan-shaped silicon strips 44 having an opening angle of 18° with the surface of said embedded silicon strips 44 made flush with the molybdenum disc 42. The fourth embodiment of FIGS. 9 and 10 provides a sputtering target more compact than the first embodiment of FIGS. 2 and 3, which can have the molybdenum silicide film varied easily and with high reproducibility as in said first embodiment. In this case, it is obviously possible to embed a molybdenum strip constituting a fan-shaped plate block in a silicon disc. However, molybdenum has great hardness, but silicon is easily broken by a shock. For the elevation of the effective life of a sputtering target, therefore, it is preferred to form fan-shaped grooves 43 in an molybdenum disc an embed fan-shaped silicon strips 44 in said grooves 43.

Figure 11:
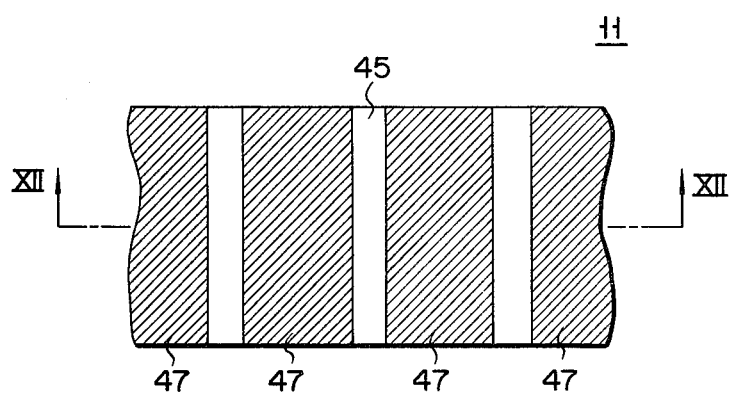
FIG. 11 is a plan view of a sputtering target according to a fifth embodiment of the invention.
Figure 12:
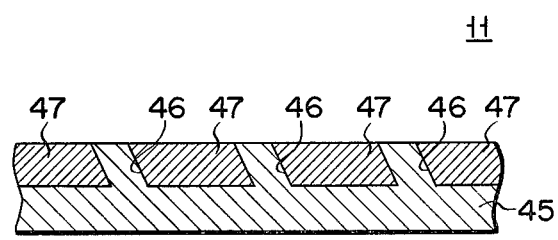
FIG. 12 is a cross sectional view on line XII—XII of the sputtering target of FIG. 11.

Further as illustrated in FIGS. 11 and 12 (fifth embodiment), it is possible to form a sputtering target by cutting grooves 46 having a parallelogram cross section in a molybdenum plate 45 in the form of stripes, and embedding silicon strips 47 having a parallelogram cross section in said grooves 46.

Throughout the foregoing embodiments, a sputtering target is formed of fan-shaped plates some of which are made of silicon and the others of which are made of molybdenum. However, this invention is not limited to such type of sputtering target. For instance, the sputtering target may be prepared from, for example, a combination of tungsten-silicon, tantalum,-silicon, platinum-silicon or titanium-silicon. A sputtering target prepared from the above-mentioned various materials in accordance with the method of this invention can indicate the same result as the foregoing embodiments. Description will now be given of the concrete method of manufacturing a tungsten-silicide sputtering target. As in the embodiment of FIGS. 2 and 3, substantially fan-shaped tungsten strips having an opening angle of 6° were mounted on a backing plate at a pitch angle of 18° and three silicon strips having an opening angle of 6° were interposed between every two adjacent tungsten strips (in a total number of 45). A sputtering target comprising a mosaic layer thus formed was subjected to sputtering by the side-sputter process of FIG. 5 with the pressure and flow rate of argon, and the magnitude of input power and plasma potential set at the same level as in the foregoing embodiments. This process provided a tungsten silicide film having a composition of $WSi_{2.7}$ with high reproducibility. When a sputtering target comprises a mosaic layer constructed by arranging strips of different materials constituting plates whose top and bottom planes are substantially fan-shaped as shown in FIGS. 2 and 3, it is preferred that the fan-shaped strips of different materials be chosen to have an opening angle ranging between 3° and 45° or preferably 6° and 30°.

The foregoing embodiments refer to the case whose a sputtering target was fitted to a sputtering equipment. However, the same result is assured even when the sputtering target is used with an ion milling equipment.

As described above, this invention can produce, for example, a high purity refractory metal silicide film of excellent quality, which suppresses abnormal discharge during sputtering and is effectively saved from variations in the film quality and the splashing of the fine particles of the target materials of said film, and is further adapted to be applied not only to the sputter-up and sputter-down processes but also to the side-sputter process which effectively prevents the contamination of said film during its formation.

What is claimed is:

1. A sputtering target comprising:
   a backing plate;
   a mosaic layer laid on the backing plate, shaped substantially as a circle and having a central hole, said layer consisting of a first group of fan-shaped plates which are made of a first target material and a second group of fan-shaped plates which are made of a second target material, said second group being divided into subgroups each consisting of at least one plate and arranged among the fan-shaped plates of the first group, said fan-shaped plates having each a notch in the narrower end, connected side by side to each other, and arranged with top surfaces flush with one another; and
   a keep jig contacting the inner peripheral edge and outer peripheral edge of the mosaic layer, thereby attaching the mosaic layer to the backing plate.

2. The sputtering target according to claim 1, wherein the open angle of each fan-shaped plate ranges from 3° to 30°.

3. The sputtering target according to claim 1 wherein the first and second target materials are silicon and molybdenum, respectively.

4. The sputtering target according to claim 1 wherein the first and second target materials are silicon and tungsten, respectively.

5. The sputtering target according to claim 1, wherein the plates contact each other along the side plane which is inclined to a perpendicular line on the backing plate.

6. The sputtering target according to claim 11 wherein the first and second target materials are silicon and molybdenum, respectively, and a conductive metal film is interposed between the plates of the first group and backing plate.

7. The sputtering target according to claim 11, wherein the first and second target materials are silicon and tungsten, respectively, and a conductive metal film is interposed between the plates of the first group and backing plate.

* * * * *

UNITED STATES PATENT AND TRADEMARK OFFICE
CERTIFICATE OF CORRECTION

PATENT NO. : 4,468,313

DATED : August 28, 1984

INVENTOR(S) : Katsuya Okumura et al.

It is certified that error appears in the above-identified patent and that said Letters Patent is hereby corrected as shown below:

On the title page:
Delete reference to Foreign Application Priority Data, i.e., Japanese Application No. 56-30209/81

Signed and Sealed this

Thirtieth Day of April 1985

[SEAL]

Attest:

DONALD J. QUIGG

Attesting Officer    Acting Commissioner of Patents and Trademarks